United States Patent [19]

Kurihara

[11] Patent Number: 5,777,348

[45] Date of Patent: Jul. 7, 1998

[54] ACTIVE MATRIX SUBSTRATE AND INSPECTING METHOD THEREOF

[75] Inventor: Takashi Kurihara, Taki-gun, Japan

[73] Assignee: Sharp Kabushiki Kaisha, Osaka, Japan

[21] Appl. No.: 664,574

[22] Filed: Jun. 17, 1996

[30] Foreign Application Priority Data

Jul. 27, 1995 [JP] Japan ................................ 7-191626
Dec. 28, 1995 [JP] Japan ................................ 7-343077

[51] Int. Cl.$^6$ .......................... H01L 29/04; H01L 31/036
[52] U.S. Cl. .......................... 257/59; 257/72; 349/54; 349/55
[58] Field of Search ..................... 257/59, 72; 349/54, 349/55

[56] References Cited

U.S. PATENT DOCUMENTS 5,223,961  6/1993  Ukai et al. ................................ 349/55
5,473,452  12/1995  Shin ........................................ 349/54

FOREIGN PATENT DOCUMENTS 02203380A  8/1990  Japan.

Primary Examiner—Tom Thomas
Assistant Examiner—Fetsum Abraham
Attorney, Agent, or Firm—Nixon & Vanderhye P.C.

[57] ABSTRACT

An active matrix substrate has a plurality of TFT elements provided in a matrix form, a gate line block and a source line block for supplying signals to the TFT elements, and a short circuit member for short-circuiting the gate line block and the source line block. The short circuit member includes a first segment and a second segment provided parallelly to each other between the gate line block and the source line block. The first segment changes from a short-circuiting state to an insulating state with laser radiation. The second segment either changes from an insulating state to a short-circuiting state with laser radiation, or has a higher electric resistance than the first segment in the short-circuiting state. Hence, destruction of insulating films and, hence, inadequate display are prevented even after inspection.

16 Claims, 9 Drawing Sheets

ACTIVE MATRIX SUBSTRATE AND INSPECTING METHOD THEREOF

FIELD OF THE INVENTION

The present invention relates to an active matrix substrate incorporated in, for example, TFT (Thin Film Transistor) type liquid crystal display devices, and further relates to an inspecting method of such a substrate.

BACKGROUND OF THE INVENTION

Figure 13:
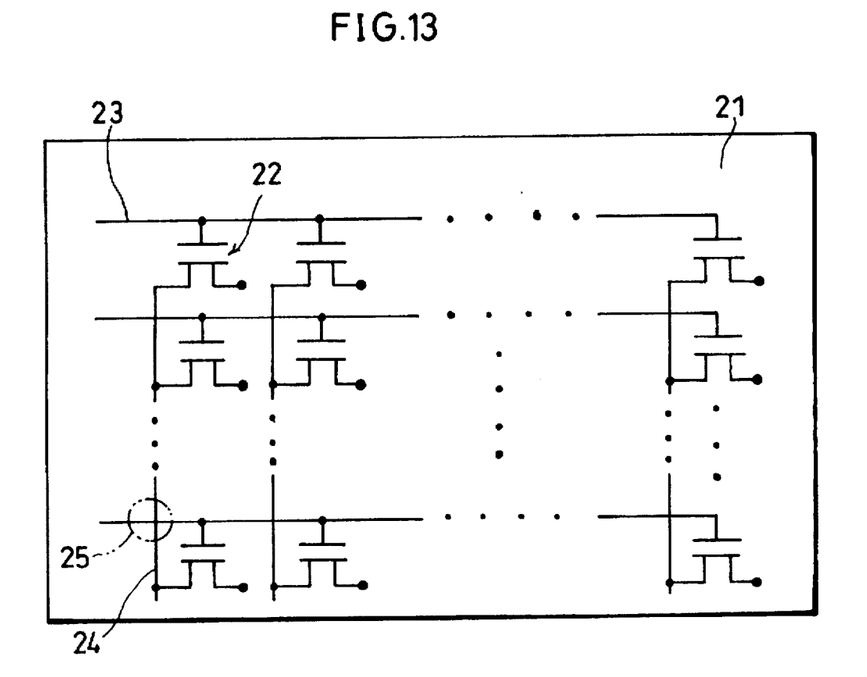
FIG. 13 is a simplified explanatory drawing showing an arrangement of a conventional active matrix substrate.

As shown in FIG. 13, an active matrix substrate incorporated in TFT type liquid crystal display devices has a plurality of TFT elements 22 provided in a matrix form on a glass substrate 21, and has a plurality of gate lines 23 and source lines 24 provided so as to cross with each other at right angles.

Figure 14:
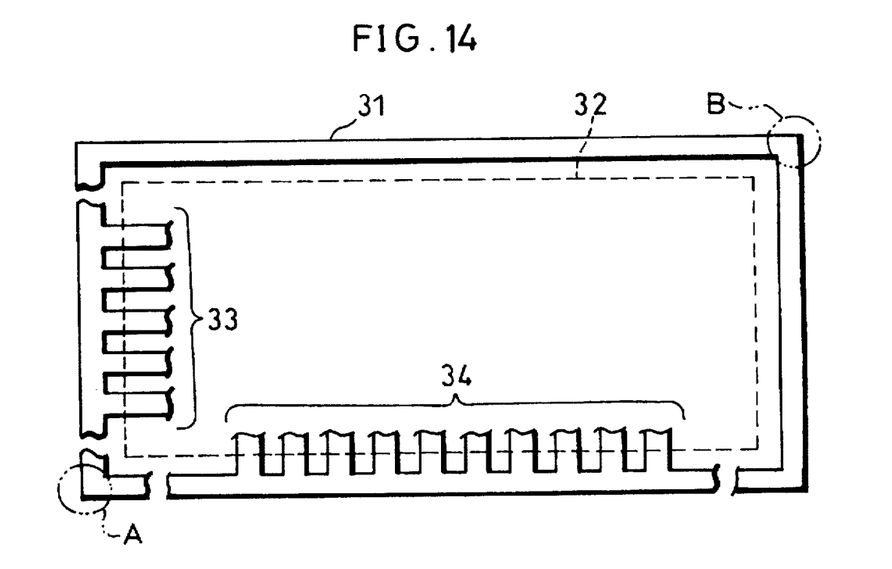
FIG. 14 is an explanatory drawing showing a short circuit member incorporated in a conventional active matrix substrate.

In such an active matrix substrate, static electricity applied externally may destruct insulating films of crossing sections 25 of the gate lines 23 and the source lines 24 or insulating films of TFT elements 22, thereby causing inadequate display. In order to prevent this kind of quality problems, a short circuit member 31 called a short ring is provided, as shown in FIG. 14, along the edges of the active matrix substrate so as to surround the active matrix area 32 in which the TFT elements 22 are provided. The short circuit member 31 short-circuits a gate line block 33 composed of a plurality of gate lines 23 and a source line block 34 composed of a plurality of source lines 24. High voltages are thus prevented from being applied to the insulating films of the crossing sections 25 of the gate lines 23 and the source lines 24, and the insulating films of the TFT elements 22. Consequently, the destruction of the insulating films and, hence, inadequate display are prevented.

Nevertheless, the above-described active matrix substrate still has the following technical problems.

After manufacturing of the substrate is completed, predetermined electric signals need to be applied independently to the gate line block 33 and to the source line block 34 for inspection of the substrate. But the inspection can not be conducted if the gate line block 33 and the source line block 34 are short-circuited with high conductivity therebetween. Therefore, for example, the short circuit member 31 is cut off in the areas A and B in FIG. 14 by laser radiation so that the gate line block 33 and the source line block 34 are insulated from each other. Then, predetermined electric signals are applied independently to the gate line block 33 and to the source line block 34 for inspection. But if the gate line block 33 and the source line block 34 remain insulated from each other even after the inspection, static electricity may infiltrate externally, thereby causing a high voltage to be applied to the insulating films of the crossing sections 25 or the insulating films of the TFT elements 22. Thus the problems happen again: the destruction of the insulating films and, hence, inadequate display.

SUMMARY OF THE INVENTION

In view of the above problems, an object of the present invention is to provide an active matrix substrate which, even after inspection, permits neither destruction of insulating films nor occurrence of inadequate display, and to provide a method of inspecting such an active matrix substrate.

In order to accomplish the object, the active matrix substrate has:

a plurality of switching means provided in a matrix form;

a gate line block and a source line block for supplying signals to the switching means; and a short circuit member for short-circuiting the gate line block and the source line block.

wherein the short circuit member includes a first segment and a second segment provided parallelly to each other between the gate line block and the source line block, the first segment changing from a short-circuiting state to an insulating state with laser radiation, and the second segment changing from an insulating state to a short-circuiting state with laser radiation.

The above arrangement enables the gate line block and the source line block of the active matrix substrate to be insulated from each other, and then short-circuited again. Therefore, the arrangement has the following effects: (1) High voltages caused by static electricity occurring during manufacturing processes of the active matrix substrate are prevented from being applied to the insulating films of the crossing sections of gate lines and source lines provided on the substrate, and to the insulating films of the switching means (e.g., TFT elements) provided on the substrate, (2) predetermined electric signals can be applied independently to the gate line block and to the source line block for inspection of the substrate, and (3) even after the inspection, high voltages are prevented from being applied to the insulating films of the crossing sections of the gate lines and the source lines, or the insulating films of the switching means. That is, the necessary inspection can be conducted. Besides, the destruction of the insulating films can be prevented before and after the inspection, which otherwise would cause inadequate display. The arrangement can therefore improve reliability and yield.

The second segment, preferably, includes a portion in which an insulating film is sandwiched between a first conductive film electrically connected to the gate line block and a second conductive film electrically connected to the source line block, the first and second conductive films being melted by laser radiation and electrically connected with each other. This enables the gate line block and the source line block to be short-circuited again.

The active matrix substrate is preferably manufactured as below. (1) The first segment is formed at the same time as the gate line block or the source line block. (2) The two kinds of conductive layers of the second segment are formed, respectively, at the same time as the gate line block and the source line block. (3) The insulating film of the second segment is formed at the same time as the insulating films of the switching means. This manufacturing method enables the first and second segments to be formed in the same manufacturing process as the gate line block, the source line block or the switching means. Therefore, the formation of the short circuit member does not require a separate new process which may cause an increase in the manufacturing costs.

Moreover, the active matrix substrate is preferably inspected as below. (1) The first segment is changed to the insulating state by the laser radiation. (2) Thereafter, the inspection is conducted by predetermined electric signals inputted independently to the gate line block and to the source line block. (3) Thereafter, the second segment is changed to the short-circuiting state by the laser radiation. This inspecting method achieves the above-noted effects.

In order to accomplish the object, the active matrix substrate has:

a plurality of switching means provided in a matrix form;

a gate line block and a source line block for supplying signals to the switching means; and a short circuit member for short-circuiting the gate line block and the source line block, wherein the short circuit member includes a first segment and a second segment provided parallelly to each other between the gate line block and the source line block, the first segment changing from a short-circuiting state to an insulating state with laser radiation, and the second segment having a higher electric resistance than the first segment in the short-circuiting state.

The above arrangement enables the gate line block and the source line block of the active matrix substrate to be short-circuited only via the second segment having a low conductivity after the first segment is changed to the insulating state by the laser radiation. In this state, predetermined electric signals can be applied independently to the gate line block and to the source line block for inspection of the substrate. Also in this state, even after the inspection, high voltages caused by static electricity are prevented from being applied to the insulating films of the crossing sections of the gate lines and the source lines, and to the insulating films of the switching means (e.g., TFT elements). That is, the necessary inspection can be conducted. Besides, the destruction of the insulating films can be prevented during the manufacturing processes of the substrate and after the inspection, which otherwise would cause inadequate display. The arrangement can therefore improve reliability and yield. In addition, the arrangement does not require the second segment to be short-circuited by laser radiation after the inspection, thereby facilitating the inspecting method.

The electric resistance of the second segment is preferably not less than 50 kΩ and not more than 1 MΩ. This setting effectively permits the above-noted effects; that is, the necessary inspection is conducted, and the destruction of the insulating films is prevented after the inspection.

Moreover, the second segment preferably includes a semiconductive layer (e.g., an n+ layer) sandwiched between a conductive film electrically connected to the gate line block and a conductive film electrically connected to the source line block. This layer makes the electric resistance of the second segment higher than that of the first segment in the short-circuiting state.

The active matrix substrate is preferably manufactured as below. (1) The first segment is formed at the same time as the gate line block or the source line block. (2) The semiconductive film of the second segment is formed at the same time as the semiconductive films of the switching means. This manufacturing method enables the first and second segments to be formed in the same manufacturing process as the gate line block, the source line block or the switching means. Therefore, the formation of the short circuit member does not require a separate new process, thus causing no increase in the manufacturing costs.

Moreover, the active matrix substrate is preferably inspected as below. (1) The first segment is changed to the insulating state by the laser radiation. (2) Thereafter, the inspection is conducted by predetermined electric signals inputted independently to the gate line block and to the source line block. This inspecting method achieves the above-noted effects.

For a fuller understanding of the nature and advantages of the invention, reference should be made to the ensuing detailed description taken in conjunction with the accompanying drawings.

BRIEF DESCRIPTION OF THE DRAWINGS

FIGS. 7(a) through 7(c) are equivalent circuit diagrams showing changes in state of the first and second segments. FIG. 7(a) showing a state before laser radiation to the first segment, FIG. 7(b) showing a state after laser radiation to the first segment, and FIG. 7(c) showing a state after laser radiation to the second segment.

FIGS. 12(a) and 12(b) are equivalent circuit diagrams showing changes in state of the first and second segments, FIG. 12(a) showing a state before laser radiation to the first segment, and FIG. 12(b) showing a state after laser radiation to the first segment.

DESCRIPTION OF THE EMBODIMENTS

Referring to FIGS. 1 through 12, the following description will discuss embodiments in accordance with the present invention.

[FIRST EMBODIMENT]

Figure 1:
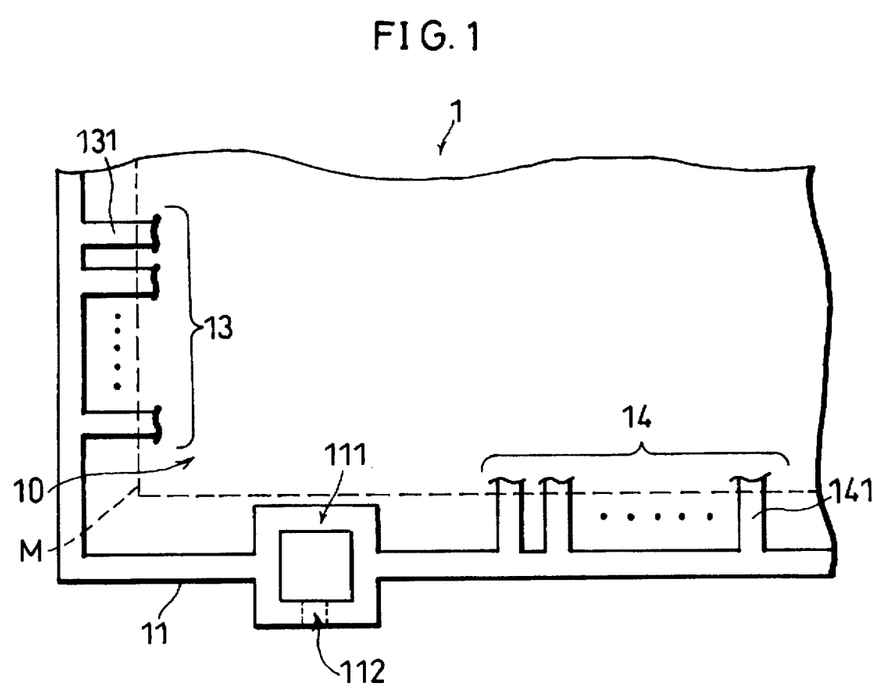
FIG. 1 is a simplified explanatory drawing showing an arrangement of an active matrix substrate of a first embodiment in accordance with the present invention.

FIG. 1 illustrates an arrangement of an active matrix substrate 1 of a first embodiment in accordance with the present invention. The active matrix substrate 1 has a plurality of TFT elements 10, a gate line block 13 composed of a plurality of gate lines 131, a source line block 14 composed of a plurality of source lines 141 and a short circuit member 11. The TFT elements 10 are provided in a matrix form in an active matrix area M. More specifically, each TFT element 10 is provided for one pixel. The TFT elements 10 are switching means for controlling the application of drive voltages to display elements (not shown), such as liquid crystal molecules, in accordance with signals from the gate lines 131 and the source lines 141.

Figure 2:
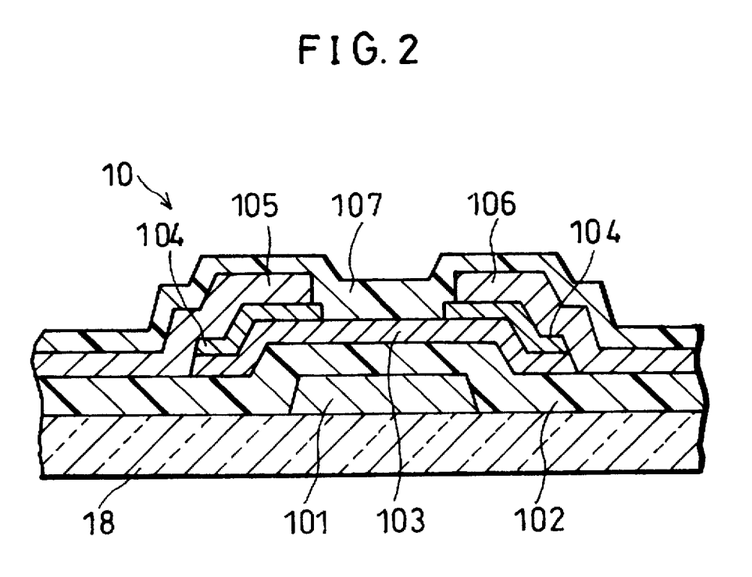
FIG. 2 is a simplified cross-sectional view showing an arrangement of a TFT element incorporated in the active matrix substrate.

FIG. 2 is a cross-sectional view illustrating an arrangement of the TFT element 10. The TFT element 10 has, on a glass substrate 18, a gate electrode 101, a gate insulating film 102, a semiconductive layer 103, n+ layers (P-type semiconductive layers) 104, a source electrode 105, a drain electrode 106 and a protection layer 107. The gate electrode 101, a conductive film connected to the gate line 131, is usually formed integrally with the gate line 131. The source electrode 105, a conductive film connected to the source line 141, is usually formed integrally with the source line 141. The n+ layers 104 are semiconductive layers doped with impurities, such as phosphorus.

Note that the TFT element 10 is not limited to have the above arrangement. The TFT may have any arrangement which constitutes a gate electrode, a source electrode and an insulating film (the gate insulating film 102 in the above arrangement) between the gate and source electrodes.

Referring to FIG. 1 again, the short circuit member 11 short-circuits the gate line block 13 and the source line block 14. In addition, the short circuit member 11 has a first segment 111 and a second segment 112 provided parallelly between the gate line block 13 and the source line block 14. As discussed later, the first segment 111 changes from a short-circuiting state to an insulating state with laser radiation, while the second segment 112 changes from an insulating state to a short-circuiting state with laser radiation.

Figure 3:
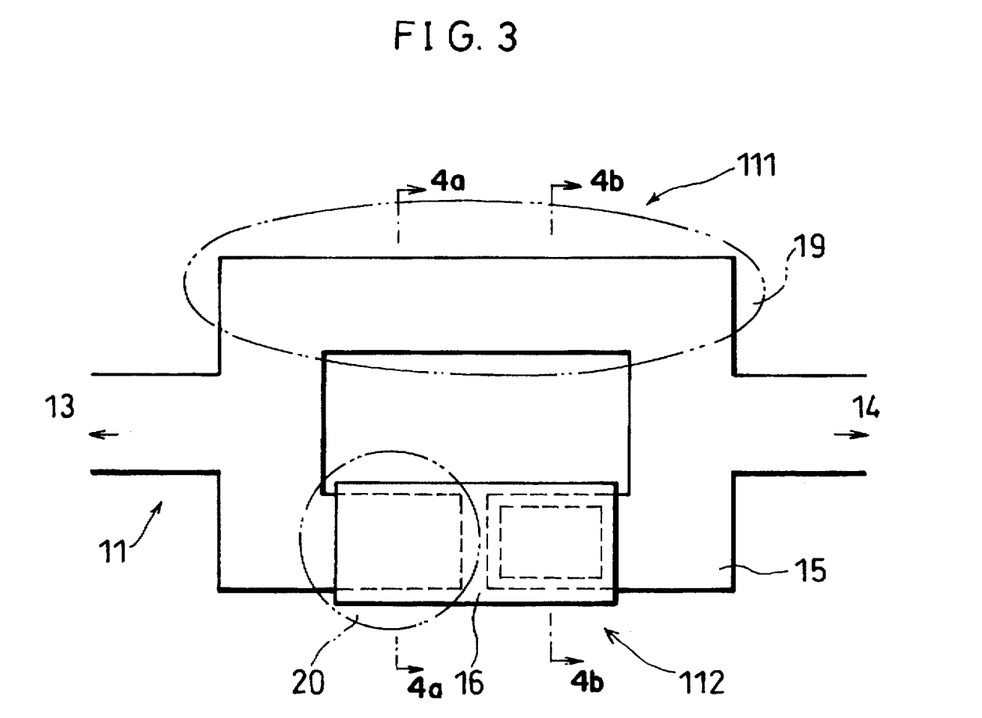
FIG. 3 is a plan view showing a first segment and a second segment of a short circuit member incorporated in the active matrix substrate.
Figure 4A:
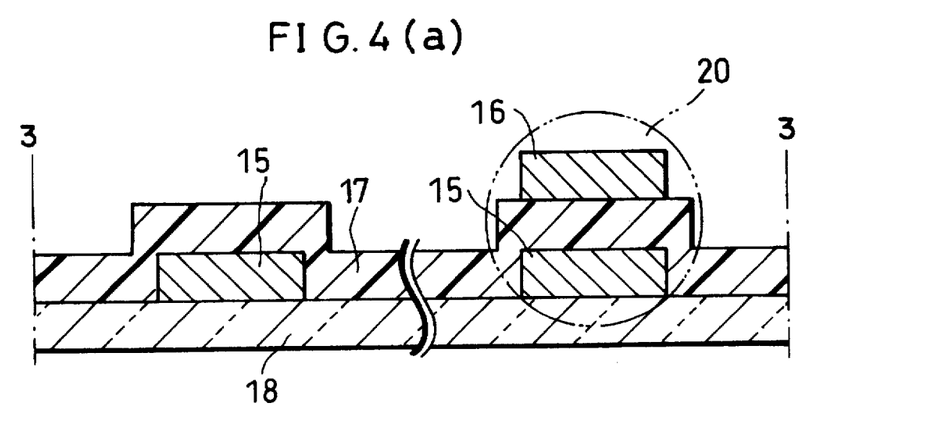
FIGS. 4(a) and 4(b) are cross-sectional views, respectively, at the V—V line and at the W—W line in FIG. 3.
Figure 4B:
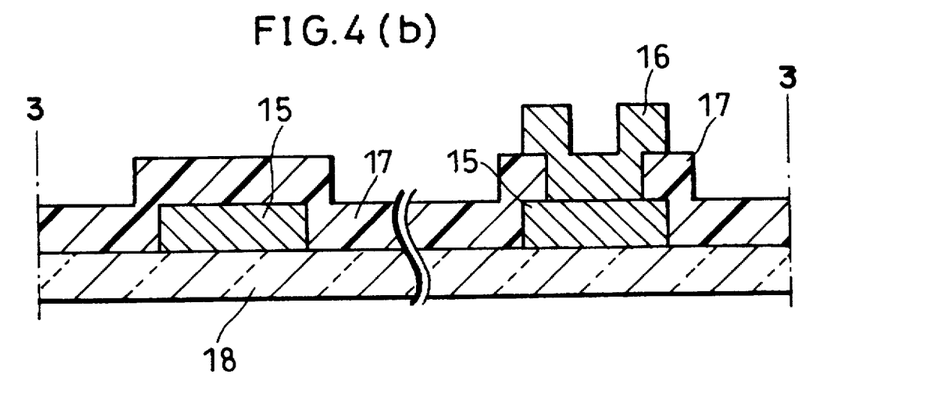

FIG. 3 is a plan view showing the first and second segments 111 and 112 of the short circuit member 11, while FIGS. 4(a) and 4(b) are cross-sectional views at the V—V line and the W—W line in FIG. 3. The short circuit member 11 is composed of a conductive film 15 made of, for example, a metallic film, except a part of the second segment 112. The conductive film 15 is formed on the glass substrate 18 at the same time as the gate lines 131. The first segment 111, composed of a portion 19 of the conductive film 15, is in the short-circuiting state before an inspection which will be described later. Meanwhile, the second segment 112 has the conductive film 15 as a first conductive film, an insulating film 17 and a second conductive film 16 which is made of, for example, a metallic film. The second segment 112 is in the insulating state before the inspection, and includes a capacity-structure portion 20 in which the insulating film 17 is sandwiched between the conductive film 15 and the second conductive film 16. The second conductive film 16 is formed on the conductive film 15 and on the insulating film 17 at the same time as the source lines 141. The insulating film 17 is formed on the glass substrate 18 and on the conductive film 15 at the same time as the gate insulating film 102.

Note that the conductive film 15 and the second conductive film 16 may be formed at the same time as the source lines 141 and the gate lines 131 respectively.

Figure 5:
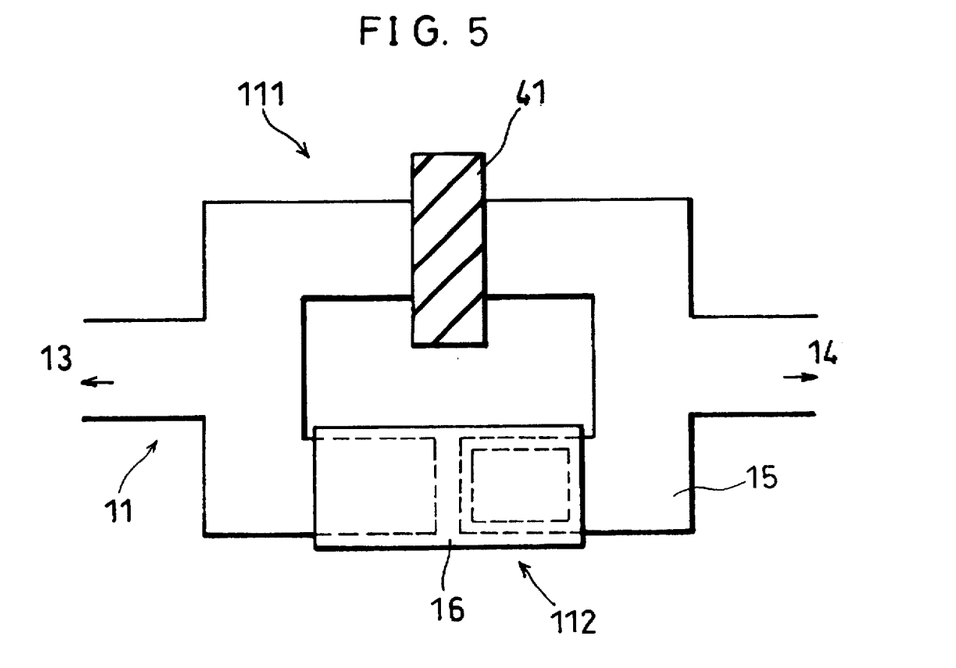
FIG. 5 is a plan view showing that the first segment is in an insulating state.

After the active matrix substrate 1 of the above arrangement is manufactured, predetermined voltages are applied independently to the gate line block 13 and to the source line block 14 for the inspection. Right before the inspection, laser beams are radiated to the first segment 111, which, as shown in FIG. 5, destructs a part of the conductive film 15 in the first segment 111, and thus forms an insulating portion 41 (shown as the area with slanting lines in FIG. 5). The first segment 111 thus changes from the short-circuiting state to the insulating state with the laser radiation. Since the second segment 112 is in the insulating state at that time, the gate and source line blocks 13 and 14 are insulated from each other. Therefore, the inspection of the TFT element 10 can be conducted by predetermined electric signals applied independently to the gate line block 13 and to the source line block 14.

Figure 6A:
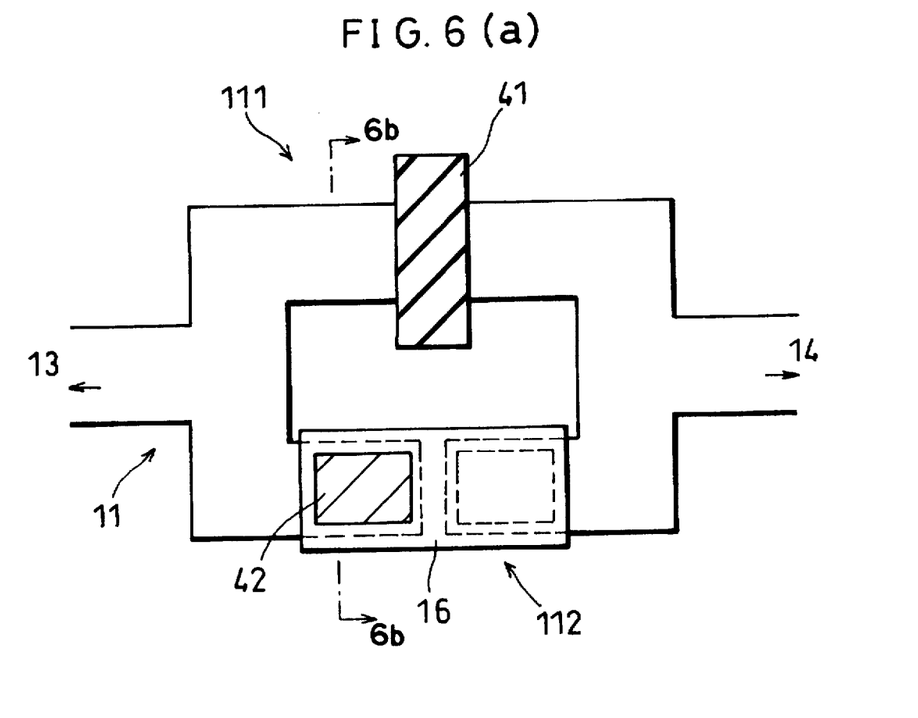
FIG. 6(a) is a plan view showing that the second segment is in a conducting state.
Figure 6B:
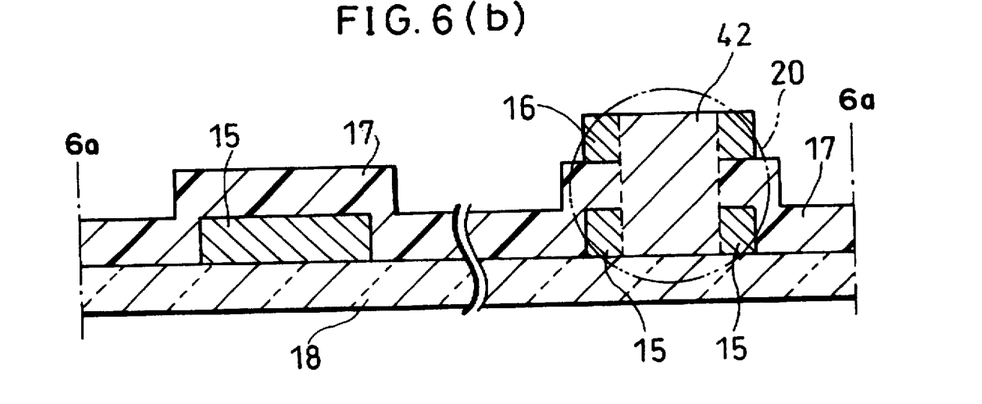
FIG. 6(b) is a cross-sectional view at the X—X line in FIG. 6(a).

After that inspection, laser beams are radiated to the capacity-structure portion 20 of the second segment 112. As shown in FIGS. 6(a) and 6(b), the laser radiation melts a part of the conductive film 15 and a part of the second conductive film 16 and breaks through the insulating film 17, thus forming a conductive portion 42 (shown as the areas with slanting lines in FIGS. 6(a) and 6(b)). The second segment 112 thus changes from the insulating state to the short-circuiting state with the laser radiation; that is, the gate and source line blocks 13 and 14 are again short-circuited. Therefore, even after the inspection, the destruction of the insulating films due to external static electricity is prevented.

Figures 7A, 7B:
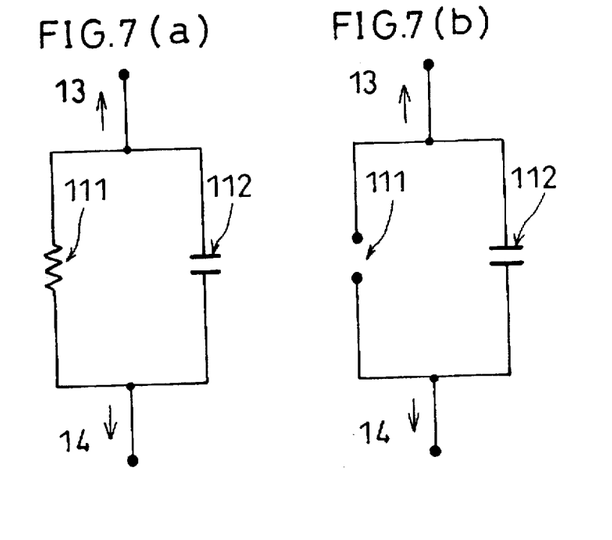
Figure 7C:
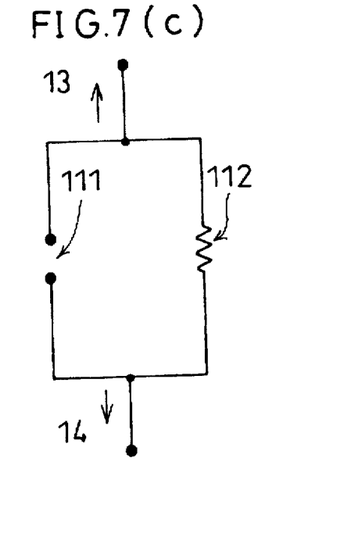

Referring to FIGS. 7(a) through 7(c), the following description will discuss the changes in state of the first and second segments 111 and 112. FIG. 7(a) is an equivalent circuit diagram before the laser radiation to the first segment 111 and shows that the first segment 111 short-circuits the gate line block 13 and the source line block 14. FIG. 7(b) is an equivalent circuit diagram after the laser radiation to the first segment 111 and shows that both the first and second segments 111 and 112 are in the insulating state. In other words, the gate line block 13 and the source line block 14 are insulated from each other after the laser radiation to the first segment 111. FIG. 7(c) is an equivalent circuit diagram after the laser radiation to the second segment 112 and shows that second segment 112 is in the short-circuiting state. Since the second segment 112 short-circuits the gate line block 13 and the source line block 14, the destruction of the insulating films and, hence, inadequate display are prevented.

Moreover, the short circuit member 11 having the first and second segments 111 and 112 is formed as part of the manufacturing process of the gate lines 131, the source lines 141 or the TFT element 10. As a result, the formation of the short circuit member 11 does not require a separate new process which may cause an increase in the manufacturing costs.

[SECOND EMBODIMENT]

Referring to FIGS. 8 through 12, the following description will discuss a second embodiment in accordance with the present invention. Here, for convenience, members of the second embodiment that have the same arrangement and function as members of the first embodiment, and that are mentioned in the first embodiment are indicated by the same reference numerals and description thereof is omitted.

Figure 8:
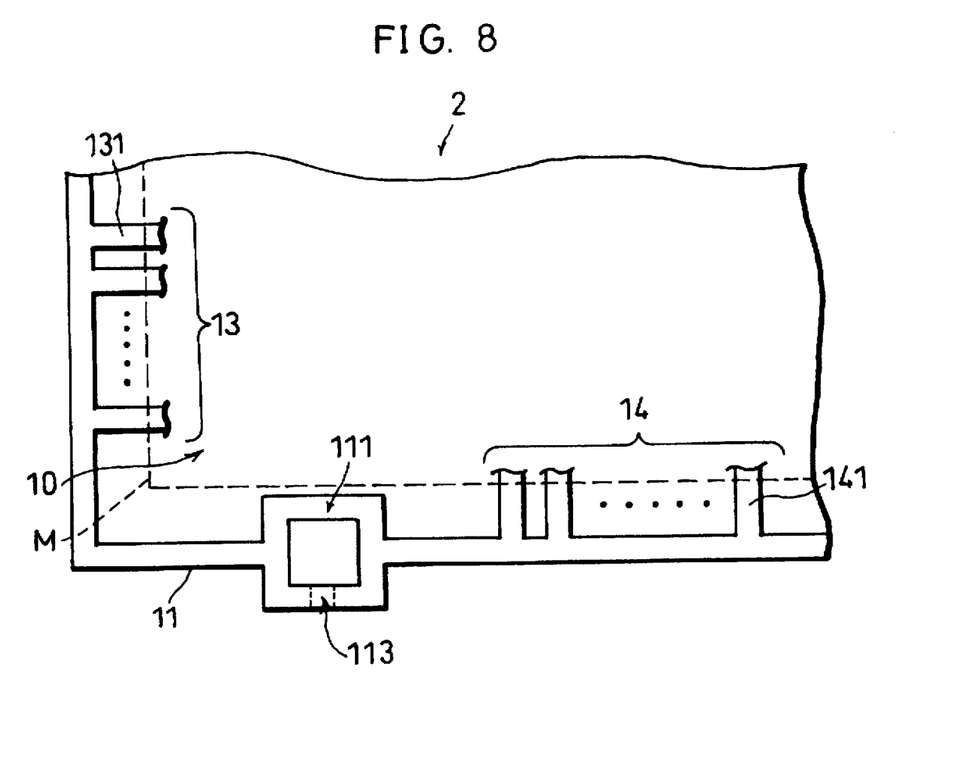
FIG. 8 is a simplified explanatory drawing showing an arrangement of an active matrix substrate of a second embodiment in accordance with the present invention.

As shown in FIG. 8, an active matrix substrate 2 of the present embodiment has the same arrangement as the active matrix substrate 1, except that the second segment 112 is replaced with a second segment 113.

Figure 9:
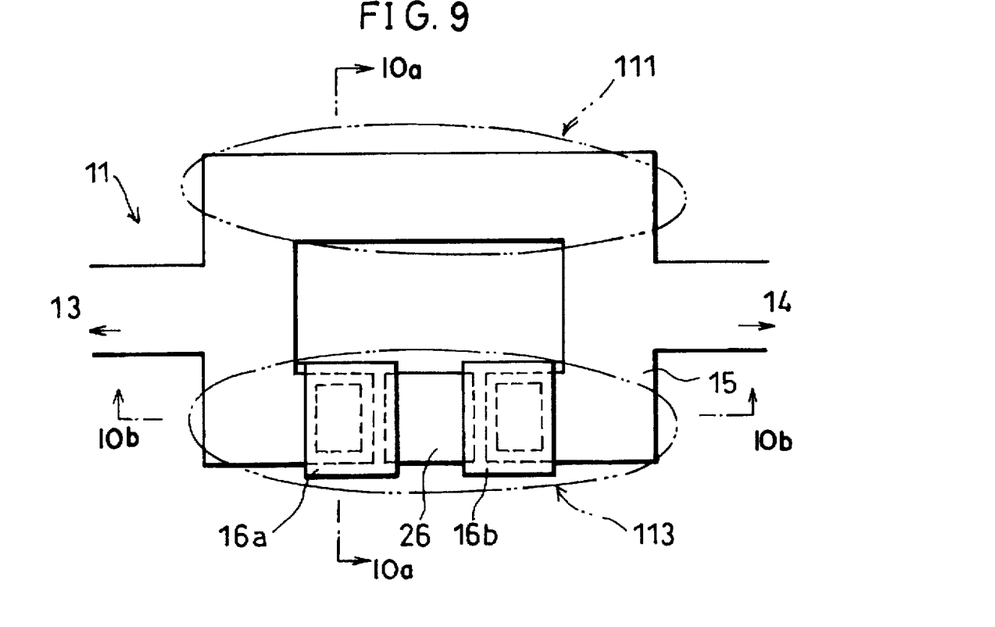
FIG. 9 is a plan view showing a first segment and a second segment of a short circuit member incorporated in the active matrix substrate.
Figure 10:
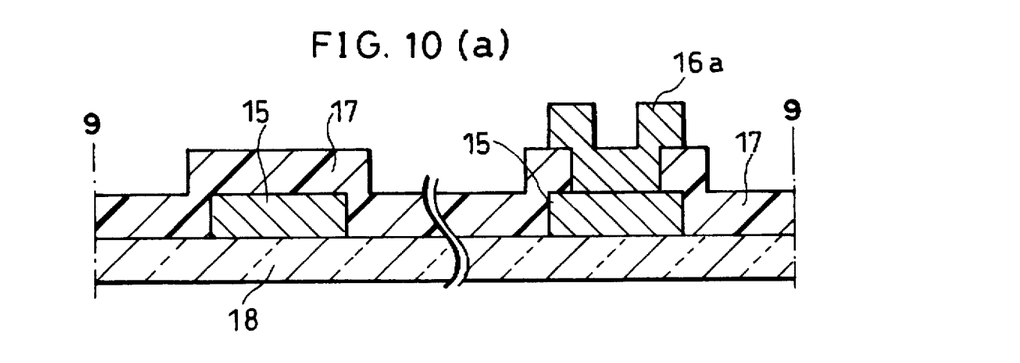
FIGS. 10(a) and 10(b) are cross-sectional views, respectively, at the Y—Y line and at the Z—Z line in FIG. 9.

FIG. 9 is a plan view showing the first and second segments 111 and 113 provided parallelly, while FIGS. 10(a) and 10(b) are cross-sectional views, respectively, at the Y—Y line and at the Z—Z line in FIG. 9. The second segment 113 has a conductive film 15, an insulating film 17, an n+ layer (P-type semiconductive layer) 26 and second conductive films 16a and 16b. The n+ layer 26, a semiconductive layer doped with impurities, such as phosphorus, is formed at the same time as the n+ layers 104 of the TFT element 10. In the second segment 113, the second conductive film 16a is connected to the conductive film 15 on the gate line block 13 side, and the second conductive film 16b is connected to the conductive film 15 on the source line block 14 side. In addition, the second conductive films 16a and 16b are connected to each other via the n+ layer 26. This design causes the electric resistance of the second segment 113 to be higher than that of the rest of the short circuit member 11. In the present embodiment, the second segment 113 is set to have an electric resistance of 50 kΩ.

The below description will explain reasons of the above setting for the second segment 113 to have an electric resistance of 50 kΩ. In order to input predetermined electric signals independently to the gate line block 13 and to the source line block 14, the gate and source line blocks 13 and 14 are preferably insulated from each other. Nevertheless, as long as there exists an electric resistance of 50 kΩ or more between the gate line block 13 and the source line block 14, the gate and source line blocks 13 and 14 are not necessarily insulated from each other during the inspection. This is because the inspection usually employs pulses of approximately 60 Hz as the input signals. With this fact taken into consideration, the second segment 113 having an electric resistance of 50 kΩ or more meets the condition of the inspection. In contrast, in order to prevent the destruction of the insulating films due to external static electricity after the inspection, the gate and source line blocks 13 and 14 are preferably short-circuited with high conductivity. Nevertheless, as long as the existing electric resistance is 1 MΩ or less between the gate line block 13 and the source line block 14, the gate and source line blocks 13 and 14 are not necessarily short-circuited with high conductivity to prevent high voltages from being applied to the insulating films. With this fact taken into consideration, the second segment 113 having an electric resistance of 1 MΩ or less meets the condition after the inspection. In the present embodiment, the second segment 113 is set to have an electric resistance of 50 kΩ, because the electric resistance of the second segment 113 should be as small as possible in order to effectively prevent the destruction of the insulating films due to external static electricity.

Figure 11:
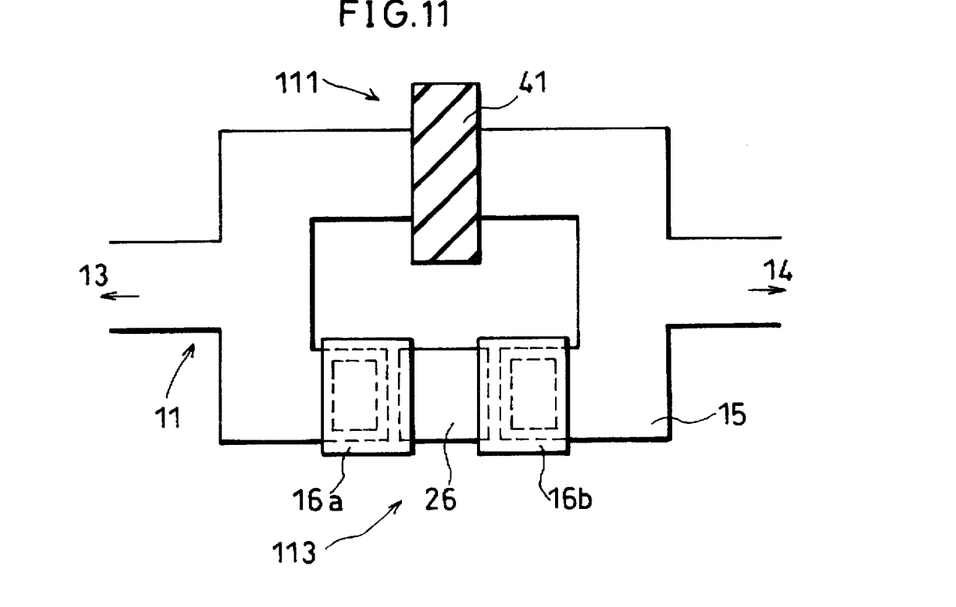
FIG. 11 is a plan view showing that the first segment is in an insulating state.

After the active matrix substrate 2 of the above arrangement is manufactured, predetermined electric signals are applied independently to the gate line block 13 and to the source line block 14 for the inspection. Right before the inspection, laser beams are radiated to the first segment 111, which, as shown in FIG. 11, destructs a part of the conductive film 15 in the first segment 111, and thus forms an insulating portion 41 (shown as the area with slanting lines in FIG. 11). The first segment 111 thus changes from the short-circuiting state to the insulating state with the laser radiation. Since the second segment 113 having an electric resistance of 50 kΩ exists between the gate and source line blocks 13 and 14 at that time, the inspection of the TFT element 10 can be conducted by predetermined electric signals applied independently to the gate line block 13 and to the source line block 14. Moreover, since the gate and source line blocks 13 and 14 are connected to each other via the second segment 113 even after that inspection, the destruction of the insulating films due to external static electricity is prevented.

Figures 12, 12B:
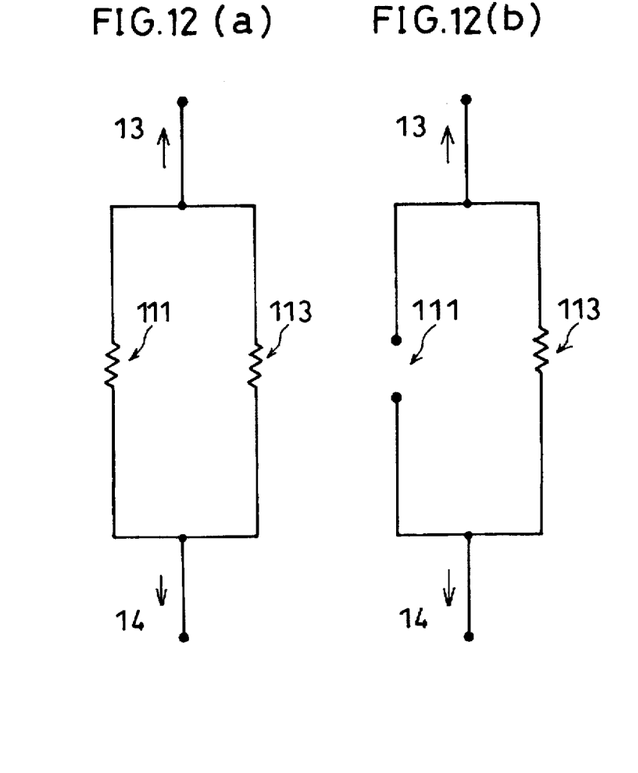

FIG. 12(a) is an equivalent circuit diagram before the laser radiation to the first segment 111 and shows that the first segment 111 short-circuits the gate line block 13 and the source line block 14. In addition, the second segment 113 having an electric resistance of 50 ko short-circuits the gate and source line blocks 13 and 14 with a low conductivity existing therebetween. Meanwhile, FIG. 12(b) is an equivalent circuit diagram after the laser radiation to the first segment 111 and shows that the first segment 111 is in the insulating state and that only the second segment 113 of a high resistance short-circuits the gate and source line blocks 13 and 14 with a low conductivity existing therebetween. This state enables the inspection to be conducted with no possible problem and also prevents the destruction of the insulating films due to external static electricity after the inspection.

Moreover, the short circuit member 11 having the first and second segments 111 and 113 is formed as part of the manufacturing process of the gate lines 131, the source lines 141 or the TFT element 10. As a result, the formation of the short circuit member 11 does not require a separate new process which may cause an increase in the manufacturing costs.

Static electricity occurs easily during manufacturing processes of the active matrix substrate 2 which include plasma treatment and rubbing treatment. The gate and source line blocks 13 and 14 need to be connected to each other with a low resistance existing therebetween during the manufacturing processes to avoid effects of that static electricity. Therefore, in the above arrangement, the first segment 111 is formed before the inspection so as to short-circuit the gate and source line blocks 13 and 14.

The invention being thus described, it will be obvious that the same may be varied in many ways. Such variations are not to be regarded as a departure from the spirit and scope of the invention, and all such modifications as would be obvious to one skilled in the art intended to be include within the scope of the following claims.

What is claimed is:

1. An active matrix substrate, comprising:

a plurality of pixel switches arranged in a matrix;

a gate line block and a source line block for supplying signals to said pixel switches; and a short circuit conductor electrically coupled to said gate line block and said source line block, wherein said short circuit conductor includes a first segment connecting gate and source line blocks, and a second segment initially insulated from said line blocks, and both first and second segments provided parallelly to each other between said gate line block and said source line block, said first segment changing the line blocks from a short-circuiting state to an insulating state with laser radiation, and said second segment changing the line blocks from an insulating state to a short-circuiting state with laser radiation.

2. The active matrix substrate as defined in claim 1, wherein said pixel switches are TFTs (Thin Film Transistors).

3. The active matrix substrate as defined in claim 1, wherein said second segment includes a portion in which an insulating film is sandwiched between a first conductive film electrically connected to said gate line block and a second conductive film electrically connected to said source line block, and said first and second conductive films are melted by laser radiation to electrically connect the first and second conductive films.

4. An active matrix substrate, comprising:

a plurality of pixel switches arranged in a matrix;

a gate line block and a source line block for supplying signals to said pixel switches; and a short circuit member short-circuiting said gate line block and said source line block, wherein said short circuit member includes a first segment conductively connects the gate and source line blocks, and a second segment resistively connects the gate and source line blocks, and both first and second segments provided parallelly to each other between said gate line block and said source line block, said first segment changing the line blocks from a short-circuiting state to an insulating state with laser radiation, and said second segment having a higher electric resistance between the line blocks than said first segment in the short-circuiting state.

5. The active matrix substrate as defined in claim 4, wherein said pixel switches are TFTs (Thin Film Transistors).

6. The active matrix substrate as defined in claim 4, wherein the electric resistance of said second segment is not less than 50 kΩ and not more than 1 MΩ.

7. The active matrix substrate as defined in claim 4, wherein said second segment includes a semiconductive layer sandwiched between a conductive film electrically connected to said gate line block and a conductive film electrically connected to said source line block.

8. The active matrix substrate as defined in claim 7, wherein said semiconductive layer is an n+ layer (P-type semiconductive layer).

9. An active matrix substrate, comprising:

a matrix of pixel switches;

a gate line block electrically connected to the pixel switches;

a source line block electrically connected to the pixel switches; and a short circuit ring around the matrix of pixel switches, and electrically connecting the gate line block to the source line block, wherein said short circuit ring includes a first segment and a second segment electrically parallel to each other, and each segment is located electrically between said gate line block and said source line block, and wherein, said first segment changing from a conductive state, in which the first segment provides a conductive connection between the gate and source line blocks, to a non-conductive state, in which the conductive connection provided by the first segment is opened between the gate and source line blocks when the first segment is irradiated by a laser, and the said second segment changing from a non-conductive state to a conductive state, in which the second segment provides a conductive connection between the gate and source line blocks when the second segment is irradiated by a laser.

10. The active matrix substrate as defined in claim 9, wherein said second are TFTs(Thin Film Transistors).

11. The active matrix substrate as defined in claim 9, wherein said second segment comprises a first conductive film conductively coupled to the gate block line and a second conductive film conductively coupled to the source block line, and an insulating film sandwiched between the first and second conductive films, and wherein when the second segment is irradiated by the laser, said insulating film is breached by at least one of said first and second conductive films, and a conductive path forms between the first and second conductive films.

12. An active matrix substrate, comprising:

a matrix of pixel switches;

a gate line block electrically connected to the pixel switches;

a source line block electrically connected to the pixel switches; and a short circuit ring around the matrix of pixel switches, and electrically connected to the gate line block and to the source line block, wherein said short circuit ring includes a first segment and a second segment electrically parallel to each other, and each segment is located electrically between said gate line block and said source line block, and said first segment changing from a conductive state, in which the first segment provides a conductive connection between the gate and source line blocks, to a non-conductive state, in which the conductive connection provided by the first segment is opened between the gate and source line blocks when the first segment is irradiated by a laser, and said second segment forms a substantially more resistive connection between the gate and the source line blocks than said conductive state of the first segment and said second segment forms a substantially more conductive connection between the gate and source line blocks than the non-conductive state of the first segment.

13. The active matrix substrate as defined in claim 12, wherein said pixel switches are TFTs (Thin Film Transistors).

14. The active matrix substrate as defined in claim 12, wherein the electric resistance of said second segment is not less than 50 kΩ and is not more than 1 MΩ.

15. The active matrix substrate as defined in claim 12, wherein said second segment includes a semiconductive layer sandwiched between a conductive film electrically connected to said gate line block and a conductive film electrically connected to said source line block.

16. The active matrix substrate as defined in claim 15, wherein said semiconductive layer is an n+ layer (P-type semiconductive layer).

* * * * *